(12) United States Patent
Costello et al.

(10) Patent No.: US 12,178,019 B2
(45) Date of Patent: Dec. 24, 2024

(54) COOLANT SYSTEM FOR A BUSBAR ASSEMBLY

(71) Applicants: TE Connectivity Services GmbH, Schaffhausen (CH); Tyco Electronics (Shanghai) Co., Ltd., Shanghai (CN)

(72) Inventors: Brian Patrick Costello, Scotts Valley, CA (US); Jie Luo, Foshan (CN)

(73) Assignee: TE CONNECTIVITY SOLUTIONS GMBH ET AL, Schaffhausen (CH)

( * ) Notice: Subject to any disclaimer, the term of this patent is extended or adjusted under 35 U.S.C. 154(b) by 192 days.

(21) Appl. No.: 17/557,112

(22) Filed: Dec. 21, 2021

(65) Prior Publication Data
US 2023/0180443 A1    Jun. 8, 2023

(30) Foreign Application Priority Data
Dec. 3, 2021  (CN) .......................... 202111469544.9

(51) Int. Cl.
*H05K 7/20*        (2006.01)
*H01R 13/533*    (2006.01)
*H02B 1/20*        (2006.01)

(52) U.S. Cl.
CPC ....... *H05K 7/20781* (2013.01); *H01R 13/533* (2013.01); *H02B 1/20* (2013.01); *H05K 7/20945* (2013.01)

(58) Field of Classification Search
None
See application file for complete search history.

(56) References Cited

U.S. PATENT DOCUMENTS

| | | | | |
|---|---|---|---|---|
| 4,992,623 A | * | 2/1991 | Briley | H01B 12/12 174/15.5 |
| 8,339,773 B2 | * | 12/2012 | Frassineti | H01H 1/58 361/677 |
| 8,717,746 B2 | * | 5/2014 | Kaufmann | H02G 5/10 361/624 |
| 8,760,855 B2 | * | 6/2014 | Howes | H05K 7/20936 361/677 |
| 9,929,388 B2 | * | 3/2018 | Lohr | H01M 50/291 |
| 10,690,414 B2 | * | 6/2020 | Gaff | H01L 21/68785 |
| 2008/0085620 A1 | * | 4/2008 | Wood | H01R 13/005 439/178 |
| 2010/0301980 A1 | * | 12/2010 | Bergamini | H01H 9/52 336/61 |
| 2017/0127578 A1 | * | 5/2017 | Cullen | H01B 12/16 |
| 2021/0243916 A1 | * | 8/2021 | Kleinschmidt | H05H 1/473 |

* cited by examiner

*Primary Examiner* — Courtney L Smith

(57) ABSTRACT

A busbar assembly includes a first busbar having a mating interface for mating with an electrical component to power the electrical component and a second busbar having a mating interface for mating with the electrical component to power the electrical component. The busbar assembly includes a first thermal conduit extending along the first busbar that allows liquid coolant to flow therethrough to dissipate heat from the first busbar. The busbar assembly includes a second thermal conduit extending along the second busbar that allows liquid coolant to flow therethrough to dissipate heat from the second busbar.

20 Claims, 8 Drawing Sheets

US 12,178,019 B2

COOLANT SYSTEM FOR A BUSBAR ASSEMBLY

CROSS REFERENCE TO RELATED APPLICATIONS

This application claims benefit to Chinese Application No. 202111469544.9, filed 3 Dec. 2021, the subject matter of which is herein incorporated by reference in its entirety.

BACKGROUND OF THE INVENTION

The subject matter herein relates generally to a busbar assembly.

Electrical devices are used in various applications, such as computer systems, data communication systems, and the like. For example, the electrical device may be a server rack, a network switch, an I/O module, and the like. Electrical components are coupled to the electrical device. Some known electrical devices include a busbar assembly for powering the electrical components. The busbar assembly generates heat when operated. The temperature of the busbar assembly limits operation of the system. For example, when operating temperatures are elevated, damage may occur to the busbar assembly or other components of the system. The size of the busbar assembly may be increased to improve operation. For example, the width and/or depth of the metal busbars may be increased to increase current carrying capacity and/or lower the operating temperature of the busbars. However, the increase in size of the busbars increases the cost of the busbar assembly and may have practical limits within the system.

A need remains for a cooling system for a busbar assembly.

BRIEF DESCRIPTION OF THE INVENTION

In one embodiment, a busbar assembly is provided including a first busbar having a mating interface for mating with an electrical component to power the electrical component and a second busbar having a mating interface for mating with the electrical component to provide a power return for the electrical component. The busbar assembly includes a first thermal conduit extending along the first busbar that allows liquid coolant to flow therethrough to dissipate heat from the first busbar. The busbar assembly includes a second thermal conduit extending along the second busbar that allows liquid coolant to flow therethrough to dissipate heat from the second busbar.

In another embodiment, a busbar assembly is provided including a first busbar having a mating interface for mating with an electrical component to power the electrical component and a second busbar having a mating interface for mating with the electrical component to provide a power return for the electrical component. The busbar assembly includes a first coolant tube coupled to the power busbar having a first coolant channel forming a first thermal conduit along the first busbar. The first coolant tube allows liquid coolant to flow through the first coolant channel to dissipate heat from the first busbar. The busbar assembly includes a second coolant tube coupled to the power busbar having a second coolant channel forming a second thermal conduit along the second busbar. The second coolant tube allows liquid coolant to flow through the second coolant channel to dissipate heat from the second busbar.

In a further embodiment, an equipment rack is provided including a frame forming a rack space configured to receive one or more electrical components and a busbar assembly coupled to the frame for powering the one or more electrical components. The busbar assembly includes a first busbar having a mating interface for mating with the electrical component to power the electrical component and a second busbar having a mating interface for mating with the electrical component to power the electrical component. The busbar assembly includes a first thermal conduit extending along the first busbar and a second thermal conduit extending along the second busbar. The first thermal conduit allows liquid coolant to flow therethrough to dissipate heat from the first busbar and the second thermal conduit allows liquid coolant to flow therethrough to dissipate heat from the second busbar.

DETAILED DESCRIPTION OF THE INVENTION

Figure 1:
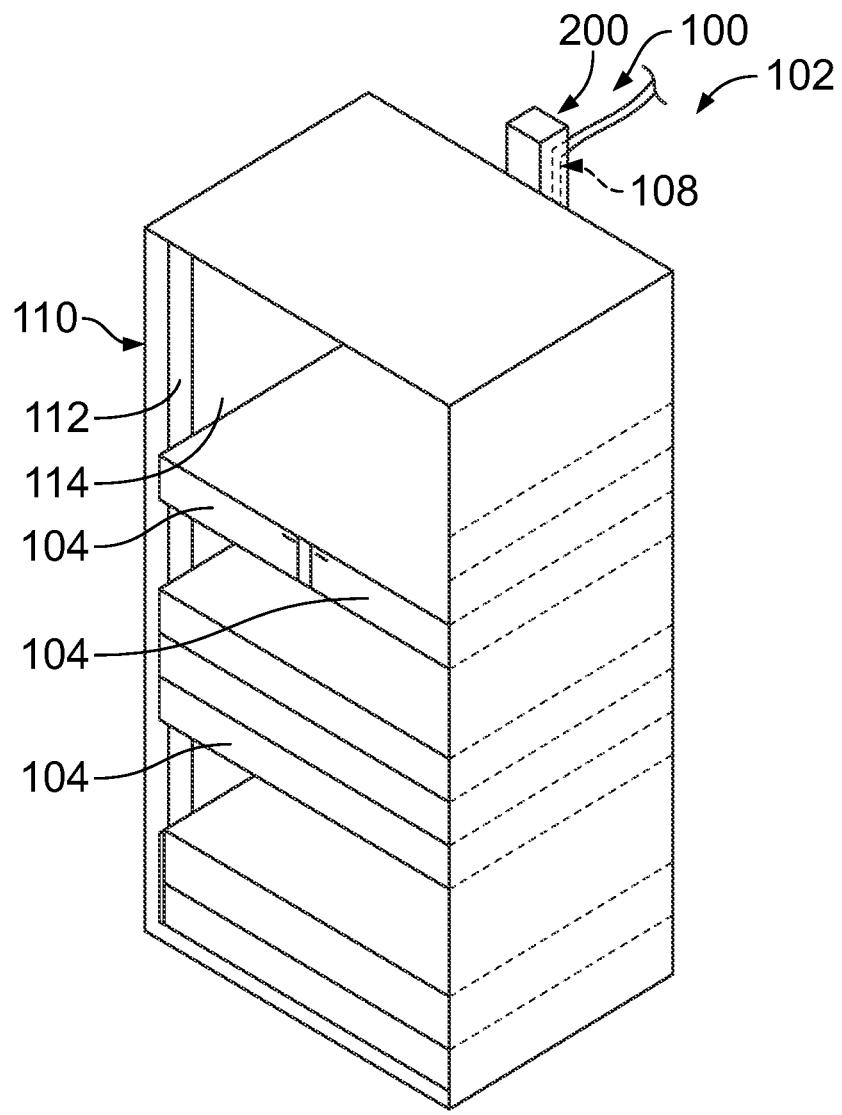
FIG. 1 is a schematic view of a cooling system in accordance with an exemplary embodiment for an electrical device.

FIG. 1 is a schematic view of a cooling system 100 in accordance with an exemplary embodiment for an electrical device 102. The electrical device 102 includes one or more electrical components 104. The cooling system 100 is used for cooling components of the electrical device 102 and/or the electrical components 104. In an exemplary embodiment, the cooling system 100 includes one or more heat exchangers 108 to transfer heat away from the electrical device 102, such as to a location remote from the electrical device 102. The cooling system 100 is coupled to the electrical device 102. In an exemplary embodiment, the cooling system 100 uses liquid coolant, such as water or other cooling fluid, to cool the components of the electrical device 102 and/or the electrical components 104.

In the illustrated embodiment, the electrical device 102 includes an equipment rack 110, such as a server rack. The equipment rack 110 includes a frame 112 for supporting a plurality of the electrical components 104. Optionally, the equipment rack 110 may include a cabinet 114 surrounding the frame 112 and the electrical components 104. In an exemplary embodiment, a busbar assembly 200 is coupled to the frame 112 and/or the cabinet 114.

The electrical components 104 are pluggable devices configured to be loaded into the equipment rack, such as a network switch, a server blade, a router, a patch panel, a pluggable drive, a memory module, a hard drive, an I/O module, or another type of communication component. In other various embodiments, the electrical components 104 may be a power supply. The power supply may be electrically coupled to the busbar assembly 200. The electrical components 104 may be coupled to the busbar assembly 200 to power the electrical components 104. The electrical components 104 may be arranged in a stack either directly on top of each other or with spaces between and coupled to the busbar assembly 200 at different heights along the busbar assembly 200.

In an exemplary embodiment, the cooling system 100 is used to cool the busbar assembly 200. Components of the cooling system 100 may extend along and/or through the busbar assembly 200 to provide direct cooling of the busbar assembly 200. In an exemplary embodiment, the cooling system 100 is a liquid cooling system for circulating liquid coolant through the busbar assembly 200 for quickly and efficiently dissipating heat from the busbar assembly 200. The liquid cooling may be more efficient than air cooling, allowing the busbar assembly 200 to operate at a lower temperature, allowing more current to flow through the busbar assembly 200. The liquid coolant of the liquid cooling system 100 may be a closed system. The interfaces between the busbar assembly 200 and the electrical components 104 are dry interfaces.

Figure 2:
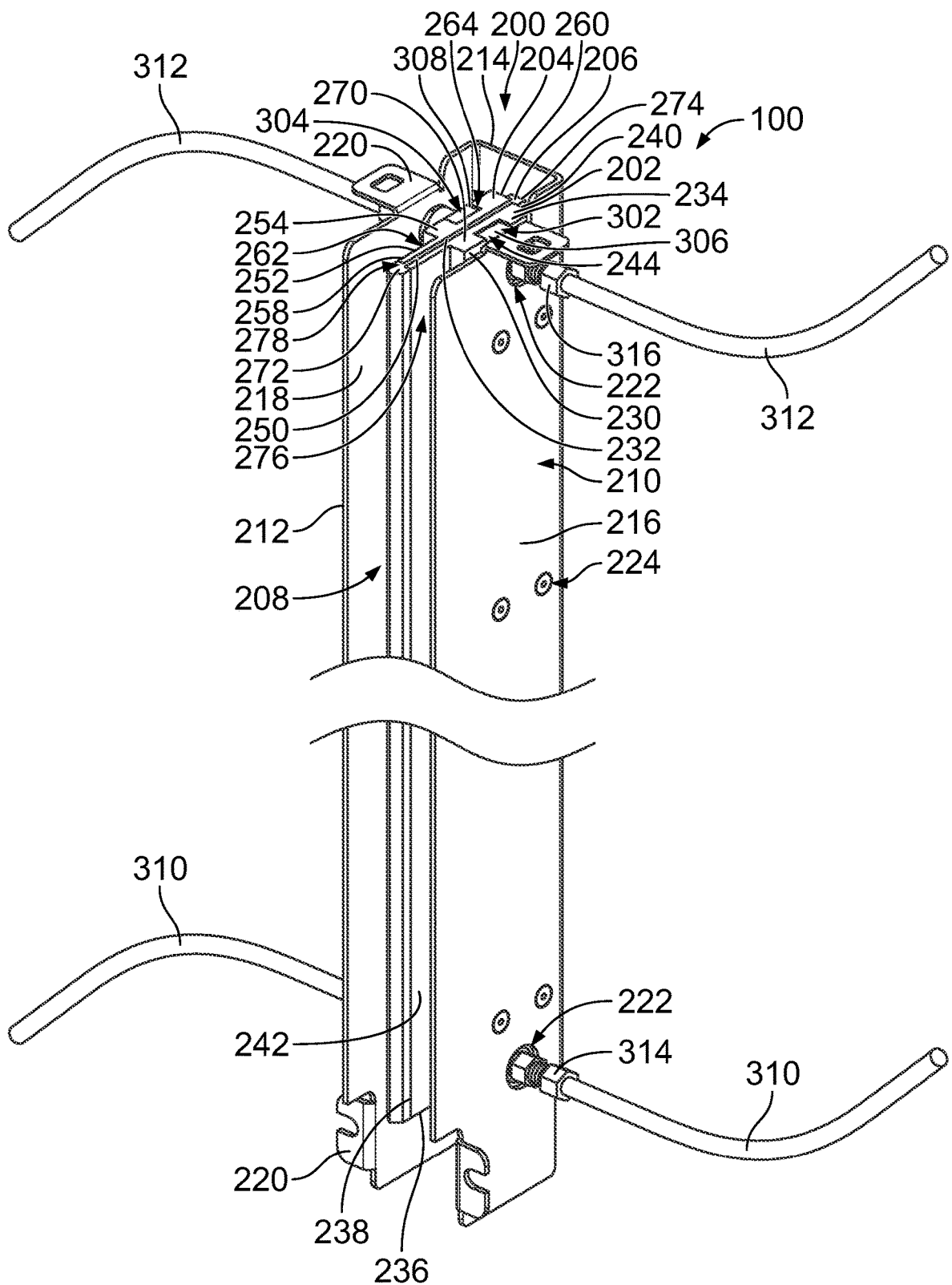
FIG. 2 is a front perspective view of the busbar assembly in accordance with an exemplary embodiment.

FIG. 2 is a front perspective view of the busbar assembly 200 in accordance with an exemplary embodiment. The busbar assembly 200 is used for supplying power to one or more of the electrical components 104 (shown in FIG. 1). In an exemplary embodiment, the cooling system 100 is integrated with the busbar assembly 200 to dissipate heat from the busbar assembly 200.

The busbar assembly 200 includes a first busbar 202 and a second busbar 204. In various embodiments, the first busbar 202 is a power busbar and the second busbar 204 is a ground return busbar. In an exemplary embodiment, the busbar assembly 200 includes an isolator panel 206 between the first busbar 202 and the second busbar 204. The isolator panel 206 electrically isolates the first busbar 202 from the second busbar 204. The first and second busbars 202, 204 together with the isolator panel 206 form a busbar element 208 for powering the electrical component 104. In an exemplary embodiment, the busbar assembly 200 is a laminated structure having the first and second busbars 202, 204 laminated together with the isolator panel 206. However, the busbar assembly 200 may have other structures in alternative embodiments, such as having the first and second busbars 202, 204 separate from each other, such as spaced apart by an air gap.

In an exemplary embodiment, the busbar assembly 200 includes a busbar cage 210 surrounding or covering the busbar element 208. The busbar cage 210 may be a stamped and formed part. For example, the busbar cage 210 may be stamped from a piece of sheet metal and formed into a U-shaped structure having an open front 212. The busbar cage 210 includes an end wall 214 at the rear of the busbar cage 210 and side walls 216, 218 extending from the end wall 214 to the front 212. The busbar element 208 is located in the space between the side walls 216, 218. The busbars 202, 204 are accessed through the front 212 by the electrical component 104. For example, the electrical component 104 may be mated with the busbars 202, 204 through the front 212 of the busbar cage 210. The busbar cage 210 covers the busbars 202, 204 to prevent inadvertent touching or short-circuiting with the first and second busbars 202, 204.

The busbar cage 210 may be coupled to the frame 112 of the equipment rack 110 (shown in FIG. 1). In an exemplary embodiment, the busbar cage 210 includes mounting brackets 220 used for mounting the busbar cage 210 to the frame 112. The mounting brackets 220 may be located at the top and the bottom of the busbar cage 210. The mounting brackets 220 may be at other locations in alternative embodiments.

In an exemplary embodiment, the first busbar 202 is a metal plate having an inner surface 230 and an outer surface 232. The inner surface 230 faces the isolator panel 206. The first busbar 202 extends between an upper end 234 and a lower end 236. The first busbar 202 extends between a front 238 and a rear 240. In an exemplary embodiment, the first busbar 202 includes one or more mating interface areas 242 for mating with the corresponding electrical component 104. In the illustrated embodiment, the mating interface area 242 is located proximate to the front 238. The electrical component 104 is mated to the front end of the first busbar 202. Optionally, the front end of the first busbar 202 may be thinner and the rear end of the first busbar 202 may be wider.

In an exemplary embodiment, the second busbar 204 is a metal plate having an inner surface 250 and an outer surface 252. The inner surface 250 faces the isolator panel 206. The second busbar 204 extends between an upper end 254 and a lower end (not shown). The second busbar 204 extends between a front 258 and a rear 260. In an exemplary embodiment, the second busbar 204 includes one or more mating interface areas 262 for mating with the corresponding electrical component 104. In the illustrated embodiment, the mating interface area 262 is located proximate to the front 258. The electrical component 104 is mated to the front end of the second busbar 204. Optionally, the front end of the second busbar 204 may be thinner and the rear end of the second busbar 204 may be wider.

The isolator panel 206 is manufactured from a dielectric material, such as a plastic material or a rubber material. The isolator panel 206 includes a central panel 270 extending between a front tab 272 and a rear tab 274. The isolator panel 206 includes a first pocket 276 extending along a first side of the central panel 270 between the front tab 272 and the rear tab 274. The first pocket 276 receives the first busbar 202. The isolator panel 206 includes a second pocket 278 extending along a second side of the central panel 270 between the front tab 272 and the rear tab 274. The second pocket 278 receives the second busbar 204. The front tab 272 is located forward of the front ends of the first and second busbars 202, 204. The rear tab 274 is located rearward of the rear ends of the first and second busbars 202, 204.

The cooling system 100 includes components forming parts of the busbar assembly 200. In an exemplary embodiment, the cooling system 100 includes a first thermal conduit 302 extending along the first busbar 202 and a second thermal conduit 304 extending along the second busbar 204. The first thermal conduit 302 allows liquid coolant to flow therethrough to dissipate heat from the first busbar 202. The second thermal conduit 304 allows liquid coolant to flow therethrough to dissipate heat from the second busbar 204. In an exemplary embodiment, the first thermal conduit 302 is defined by a first coolant tube 306 separate and discrete from the first busbar 202 and thermally coupled to the first busbar 202. In an exemplary embodiment, the second thermal conduit 304 is defined by a second coolant tube 308 separate and discrete from the second busbar 204 and thermally coupled to the second busbar 204. However, in alternative embodiments, the first and second thermal conduit 302, 304 may be defined by channels formed in the first and second busbars 202, 204 rather than being separate components coupled to the first and second busbars 202, 204.

In an exemplary embodiment, the cooling system 100 includes one or more coolant supply lines 310 coupled to the thermal conduit 302, 304 and one or more coolant return lines 312 coupled to the thermal conduit 302, 304. The coolant supply and return lines 310, 312 may be flexible hoses in various embodiments. In other embodiments, the coolant supply and return lines 310, 312 may be rigid pipes. In an exemplary embodiment, supply fittings 314 are used to couple the coolant supply lines 310 to the thermal conduits 302, 304 and return fittings 316 are used to couple the coolant return lines 312 to the thermal conduits 302, 304. The fittings 314, 316 and/or the lines 310, 312 may pass through openings 222 in the busbar cage 210 to access the thermal conduit 302, 304. Alternatively, the fittings 314, 316 and/or the lines 310, 312 may enter the interior space of the busbar cage 210 through the top and/or the bottom of the busbar cage 210.

In the illustrated embodiment, the coolant supply lines 310 are coupled to the thermal conduits 302, 304 near the bottom end of the busbar assembly 200 and the coolant return lines 312 are coupled to the thermal conduits 302, 304 near the top end of the busbar assembly 200. However, the coolant supply and return lines 310, 312 may be coupled to the thermal conduits 302, 304 at other locations in alternative embodiments, such as proximate to the middle portion of the busbar assembly 200.

Figure 3:
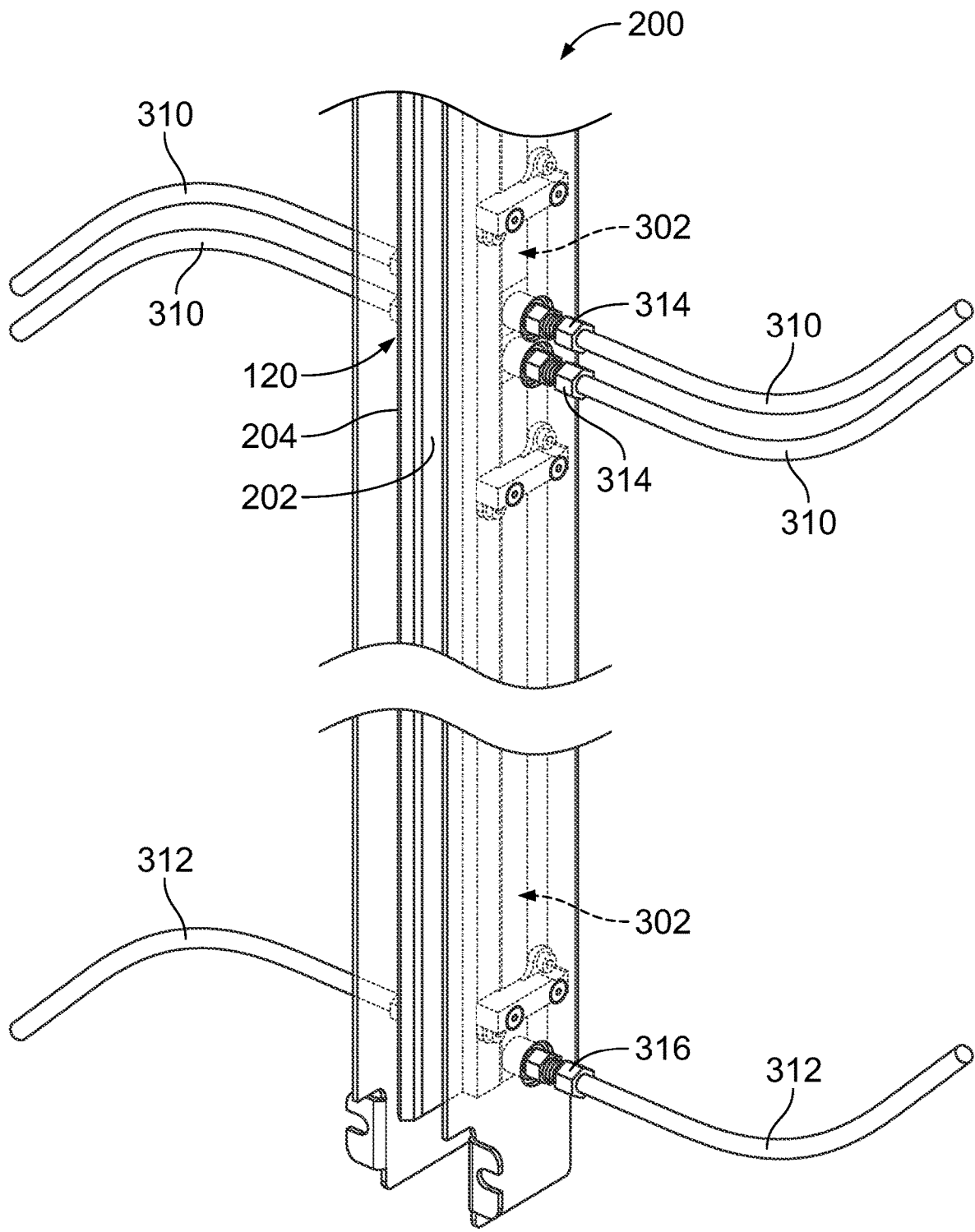
FIG. 3 is a front perspective view of the busbar assembly in accordance with an exemplary embodiment.

FIG. 3 is a front perspective view of the busbar assembly 200 in accordance with an exemplary embodiment. FIG. 3 illustrates a middle portion of the busbar assembly 200 and a lower portion of the busbar assembly 200. FIG. 3 illustrates a pair of coolant supply lines 310 coupled to corresponding first thermal conduits 302 at the middle portion of the busbar assembly 200 and a pair of coolant supply lines 310 coupled to corresponding second thermal conduits 304 (shown in FIG. 2) at the middle portion of the busbar assembly 200. Coolant return lines 310 are coupled to the corresponding thermal conduits 302, 304 at the lower portion of the busbar assembly 200. Similarly, coolant return lines 310 may be coupled to the corresponding thermal conduits 302, 304 at an upper portion (not shown) of the busbar assembly 200. In such arrangement, the coolant is supplied to the middle portion of the busbar assembly 200 and returned from the upper and lower end portions of the busbar assembly 200.

In the illustrated embodiment, each thermal conduit 302, 304 extends along approximately half of the height of the busbar assembly 200 rather than the entire height of the busbar assembly 200. In such arrangement, the coolant may be supplied to a hotspot of the busbar assembly 200, such as proximate to a power supply location 120 where a power supply is coupled to the first and second busbars 202, 204 of the busbar assembly 200. The greatest amount of heat generation may be at the hotspot where the power supply is coupled to the first and second busbars 202, 204. As such, providing the coolant supply proximate to the hotspot location provides the greatest cooling effect at the most needed location. Thermal gradients along the first and second busbars 202, 204 may be reduced by supplying the coolant to the hotspot location.

Figure 4:
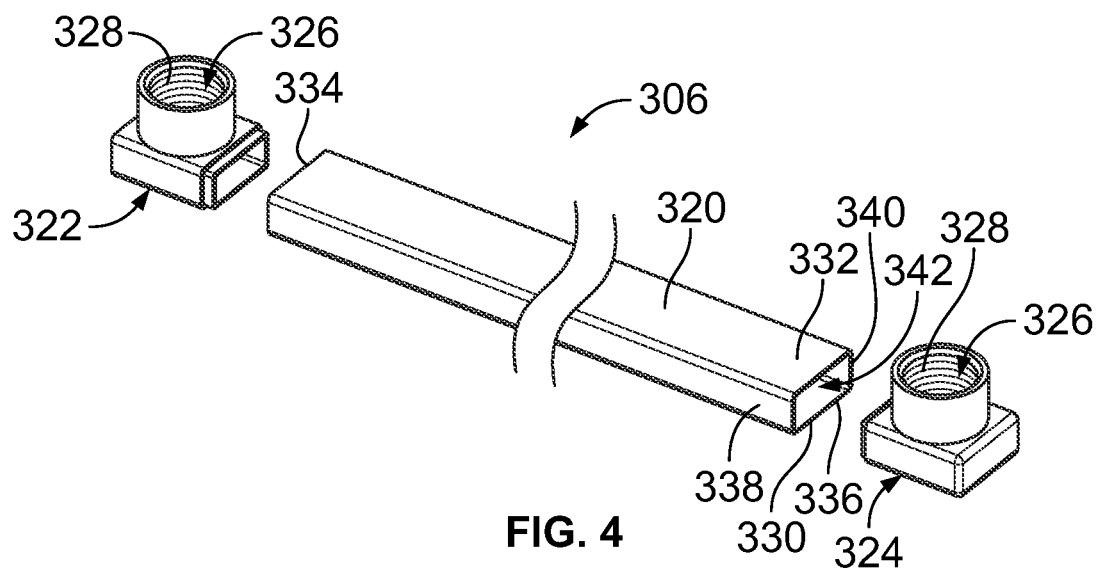
FIG. 4 is an exploded view of a first coolant tube of the cooling system in accordance with an exemplary embodiment.

FIG. 4 is an exploded view of the first coolant tube 306 in accordance with an exemplary embodiment. The first coolant tube 306 may be identical to the second coolant tube 308 (FIG. 2) and like components of the coolant tubes 306, 308 may be identified with like reference numerals in the description below.

The coolant tube 306 includes a main body 320, and upper end cap 322 and a lower end cap 324. The end caps 322, 324 may be sealed and/or joined to the main body 320. For example, the end caps 322, 324 may be welded, soldered, braised, epoxy or otherwise sealed and joined to the main body 320.

The end caps 322, 324 may be extruded metal parts. Alternatively, the end caps 322, 324 may be machined parts. The end caps 322, 324 are thermally conductive. Each end cap 322, 324 includes a port 326. In an exemplary embodiment, the port 326 has internal threads 328 for receiving the corresponding fitting 314 or 316 (shown in FIG. 2). In alternative embodiments, the end caps 322, 324 may have external threads or another type of fitting, such as an NPT fitting a union fitting, a flange fitting, a quick coupler, and the like.

In an exemplary embodiment, the main body 320 is an extruded metal part. However, the main body 320 may be a machined part in alternative embodiments. In other various embodiments, the main body 320 may be stamped and formed. The main body 320 has an inner surface 330 and an outer surface 332. The main body 320 extends between an upper end 334 and a lower end 336. The main body 320 is a front 338 and a rear 340. The main body 320 surrounds a central cavity 342 that is open at the upper end 334 and the lower end 336 for mating with the end caps 322, 324, respectively. In the illustrated embodiment, the main body 320 has a generally rectangular cross-section. Optionally, the walls defining the main body 320 may be generally flat to form the rectangular cross-section. The main body 320 may have other shapes in alternative embodiments. One or more of the walls of the main body 320 define thermal interfaces configured to be thermally coupled to the corresponding busbar 202, 204.

Figure 5:
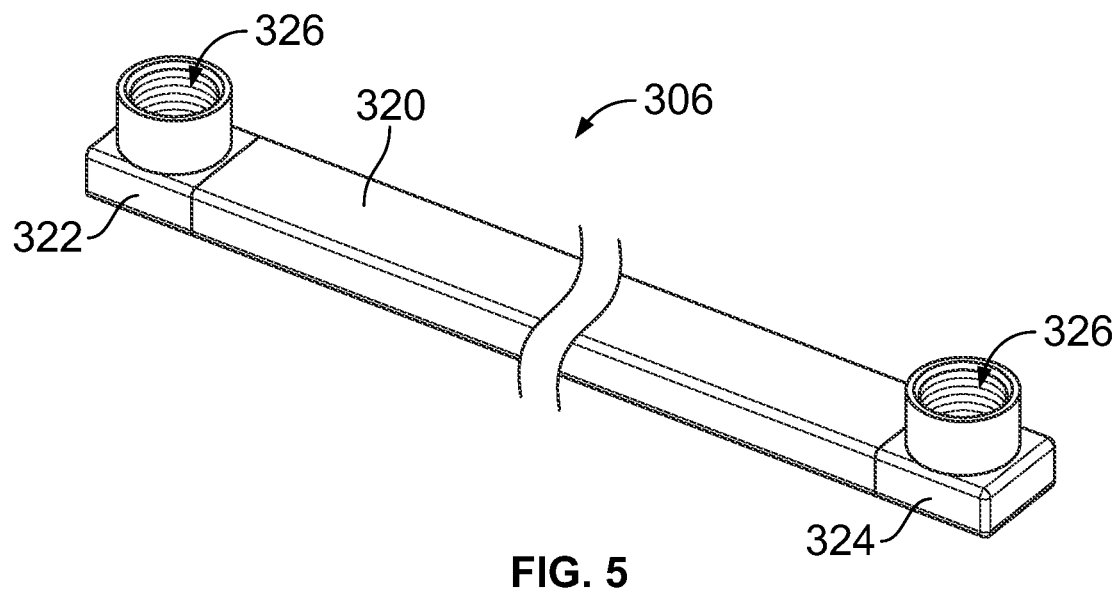
FIG. 5 is a perspective view of the coolant tube in accordance with an exemplary embodiment.

FIG. 5 is a perspective view of the coolant tube 306 in accordance with an exemplary embodiment. FIG. 5 illustrates the end caps 322, 324 coupled to the main body 320. The joints or seems between the end caps 322, 324 and the main body 320 may be sealed or otherwise made fluid tight. When joined, the coolant tube 306 forms a unitary body that defines a fluid path through the main body 320 between the upper and lower ports 326 at the upper and lower ends of the coolant tube 306. Liquid coolant is configured to flow through the coolant tube 306 to transfer heat away from the coolant tube 306 for cooling the busbar 202.

Figure 6:
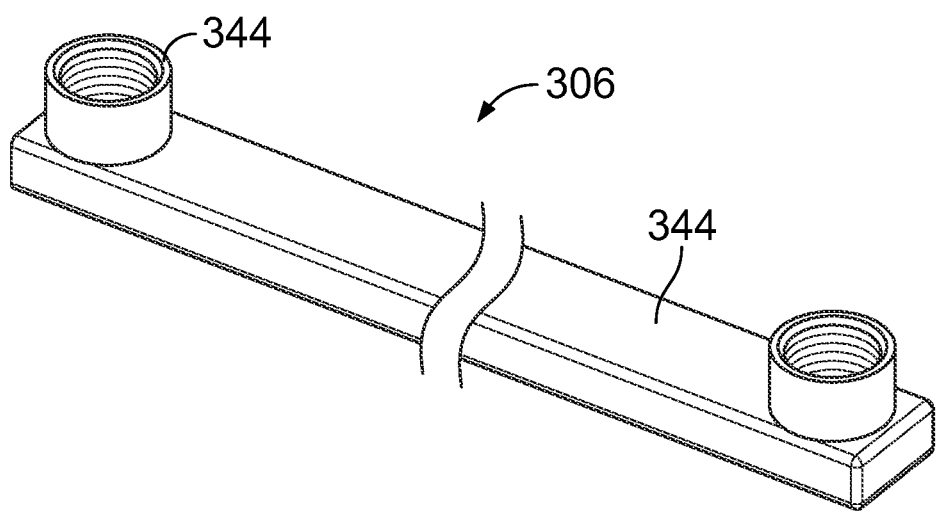
FIG. 6 is a perspective view of the coolant tube in accordance with an exemplary embodiment.

FIG. 6 is a perspective view of the coolant tube 306 in accordance with an exemplary embodiment. In an exemplary embodiment, the coolant tube 306 includes an electrical insulating layer 344 surrounding the exterior of the coolant tube 306. The electrical insulating layer 344 electrically isolates the coolant tube 306 from the busbar 202. In an exemplary embodiment, the electrical insulating layer 344 is thermally conductive to allow efficient heat transfer between the coolant tube 306 and the busbar 202. In various embodiments, the electrical insulating layer 344 may be a synthetic ceramic material, such as boron nitride, alumina, aluminum nitride, silica, or other thermally conductive and electrically insulating materials. The electrical insulating layer 344 electrically isolates the liquid coolant from the busbar 202. However, in alternative embodiments, rather than using an electrical insulating layer, a nonconductive coolant may be used.

Figure 7:
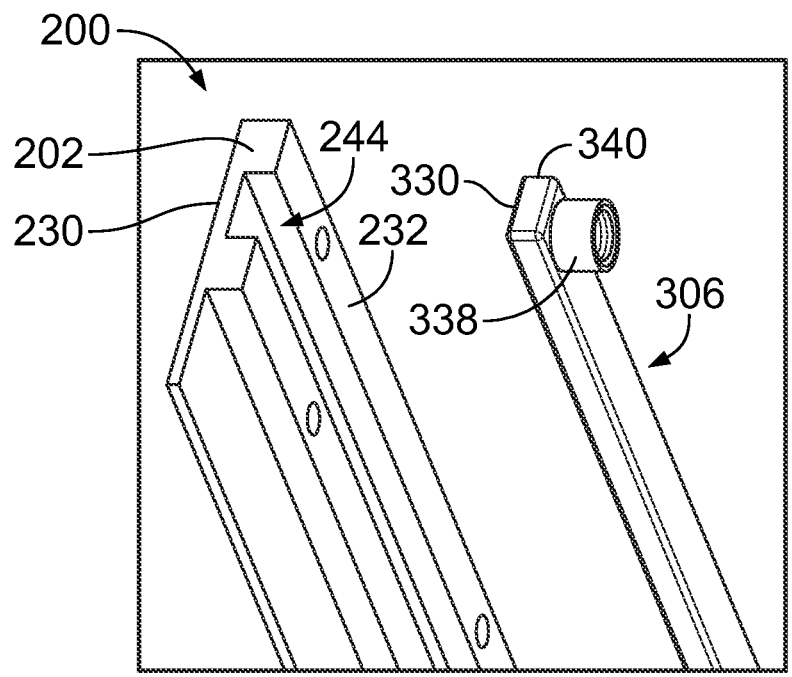
FIG. 7 is an exploded view of a portion of the busbar assembly showing portions of a first busbar and a coolant tube.

FIG. 7 is an exploded view of a portion of the busbar assembly 200 showing portions of the first busbar 202 and the first coolant tube 306. The first busbar 202 includes a busbar channel 244 formed in the rear portion of the first busbar 202. The busbar channel 244 is open at the outer surface 232 to receive the first coolant tube 306 to locate the first coolant tube 306 along the exterior of the first busbar 202. However, in alternative embodiments, the busbar channel 244 may be open at the inner surface 230 to locate the first coolant tube 306 along the interior of the first busbar 202. In the illustrated embodiment, the busbar channel 244 is U-shaped having an end wall and opposite side walls forming the busbar channel 244. The inner surface 330 of the coolant tube 306 is configured to interface with the end wall while the front 338 and the rear 340 of the coolant tube 306 are configured to interface with the side walls. The interface provides a large amount of surface area contact between the coolant tube 306 and the busbar 202 for thermal transfer therebetween. For example, greater than 50% of the surface area of the coolant tube 306 may be in direct thermal contact with the busbar 202.

Figure 8:
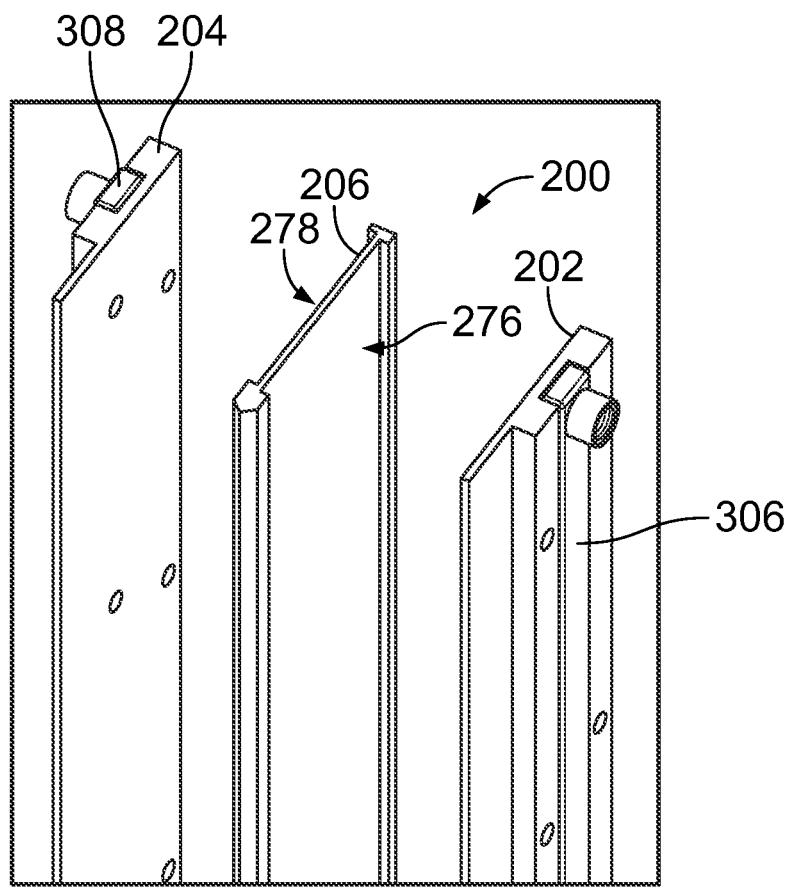
FIG. 8 is an exploded view of a portion of the busbar assembly in accordance with an exemplary embodiment.

FIG. 8 is an exploded view of a portion of the busbar assembly 200 showing the isolator panel 206 between the first and second busbars 202, 204 and the first and second coolant tubes 306, 308. The first and second coolant tubes 306, 308 are shown coupled to the first and second busbars 202, 204 in the illustrated embodiment. The first and second busbars 202, 204 are aligned with the first and second pockets 276, 278. During assembly, the busbars 202, 204 are loaded into the pockets 276, 278. The busbars 202, 204 may be secured to the isolator panel 206, such as using adhesive or other processes, such as heat and pressure to couple the busbars 202, 204 to the isolator panel 206.

Figure 9:
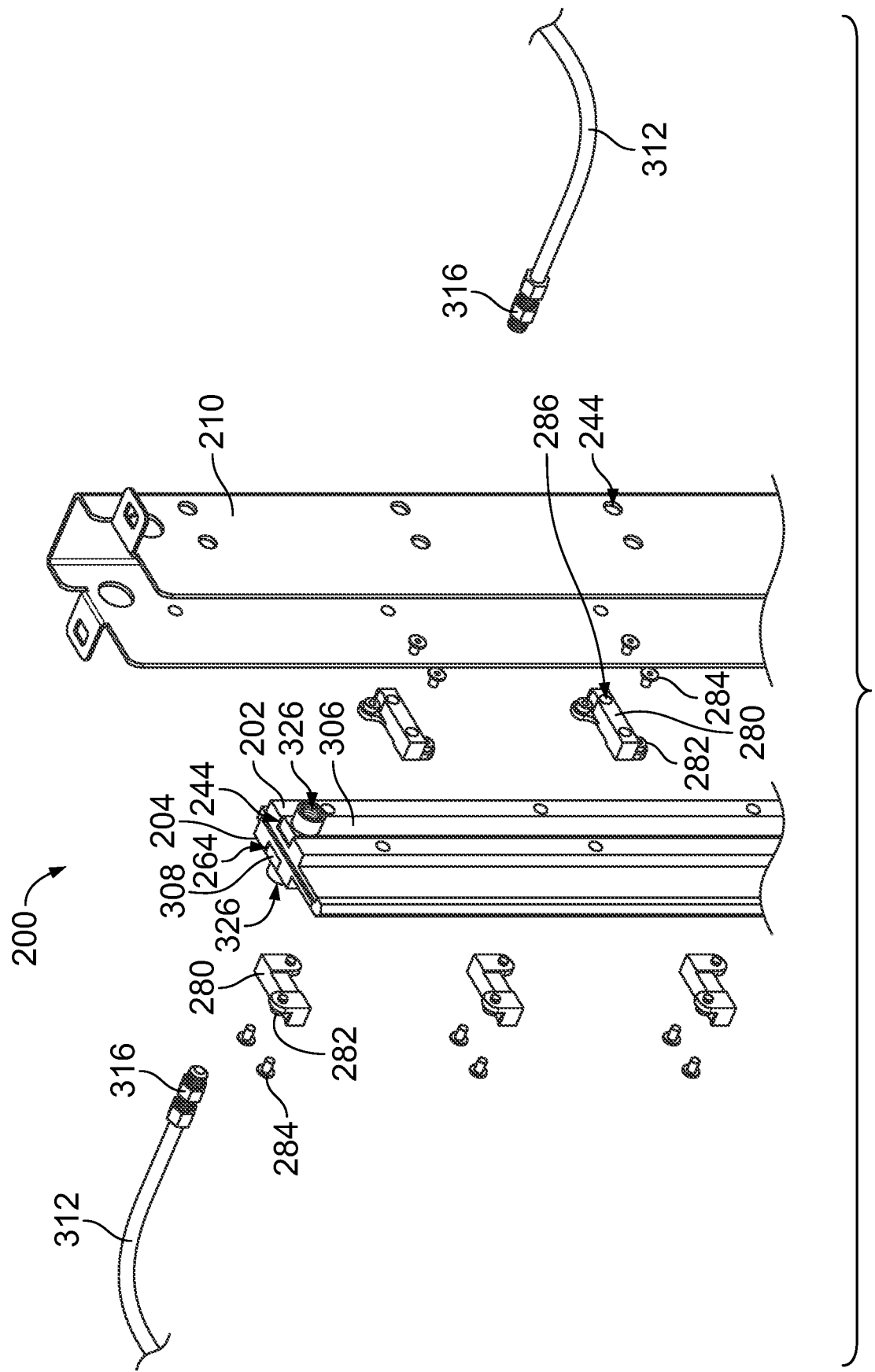
FIG. 9 is an exploded view of a portion of the busbar assembly in accordance with an exemplary embodiment.

FIG. 9 is an exploded view of a portion of the busbar assembly 200 showing the mounting brackets 280 used for mounting the assembled busbar structure to the busbar cage 210. During assembly, the mounting brackets 280 are coupled to the busbars 202, 204 using fasteners 282. The mounting bracket 280 extends along the outer surface 332 of the corresponding coolant tube 306, 308 to retain the coolant tube 306, 308 in the busbar channel 244, 264 of the corresponding busbar 202, 204. In an exemplary embodiment, as the fasteners 282 are coupled to the busbar 202, 204, the mounting bracket 280 compresses the coolant tube 306, 308 into the busbar channel 244, 264 to ensure thermal contact between the coolant tube 306, 308 and the busbar 202, 204.

In an exemplary embodiment, the busbar cage 210 is coupled to the mounting brackets 280 using fasteners 284. For example, the fasteners 284 may pass through openings 224 in the busbar cage 210 and into openings 286 in the mounting brackets 280 to secure the busbar cage 210 to the mounting brackets 280. The fasteners 284 may be threaded fasteners. Other types of securing elements may be used in alternative embodiments to secure the mounting brackets 280 to the busbar cage 210. Once assembled, the coolant lines 312 may be coupled to the coolant tubes 306, 308. For example, the fittings 316 may be threadably coupled to the ports 326 in the coolant tubes 306, 308.

Figure 10:
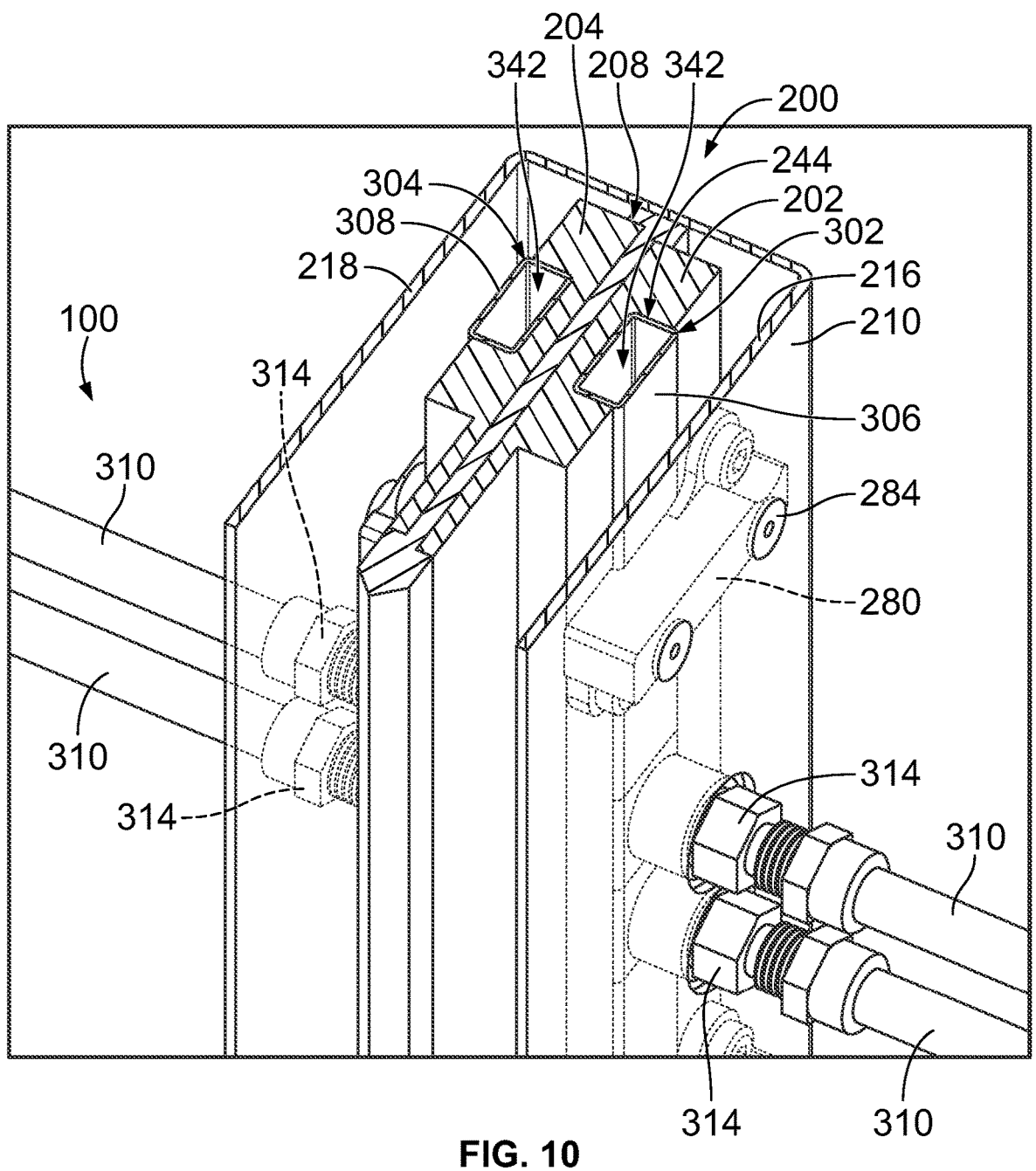
FIG. 10 is a cross-sectional view of a portion of the busbar assembly in accordance with an exemplary embodiment.

FIG. 10 is a cross-sectional view of a portion of the busbar assembly 200 in accordance with an exemplary embodiment. The busbar element 208 is located in the cage space of the busbar cage 210 between the side walls 216, 218. The side walls 216, 218 are coupled to the mounting brackets 280 (shown in phantom) by the fasteners 284. The mounting brackets 280 position the busbar element 208 in the cage space of the busbar cage 210. For example, the mounting brackets 280 may center the busbar element 208 between the side walls 216, 218.

The first and second thermal conduit 302, 304 extend vertically along the first and second busbars 202, 204. The thermal conduits 302, 304 dissipate heat from the busbars 202, 204. In the illustrated embodiment, the thermal conduits 302, 304 are defined by the first and second coolant tubes 306, 308. Optionally, the coolant tubes 306, 308 to be press-fit into the busbars 202, 204. The coolant tubes 306, 308 are thermally coupled to the busbars 202, 204. The liquid coolant flowing through the central cavities 342 of the coolant tubes 306, 308 transfer the heat away from the coolant tubes 306, 308 as the liquid coolant is circulated through the cooling system 100. FIG. 10 illustrates a pair of the coolant supply lines 310 coupled to a pair of the first coolant tubes 306 extending along the first busbar 202, which form a pair of cooling circuits for the first busbar 202. Similarly, a pair of the coolant supply lines 310 are provided for a pair of the second coolant tubes 306 extending along the second busbar 204. The coolant supply lines 310 are coupled to the corresponding coolant tubes 306, 308 by the supply fittings 314. In the illustrated embodiment, the ends of the pair of first coolant tubes 306 abut against each other within the busbar channel 244 of the first busbar 202. The liquid coolant is configured to flow upward through the upper coolant tube 306. The liquid coolant is configured to flow downward through the lower coolant tube 306. However, in alternative embodiments, a single coolant tube 306 may be provided for in a single cooling circuit for the first busbar 202. The cooling system 100 is used to lower the operating temperatures of the busbars 202, 204, which may allow for the use of smaller less costly busbars 202, 204 or may allow for operating at higher currents than busbar assemblies 200 that to not utilize a liquid cooling system.

Figure 11:
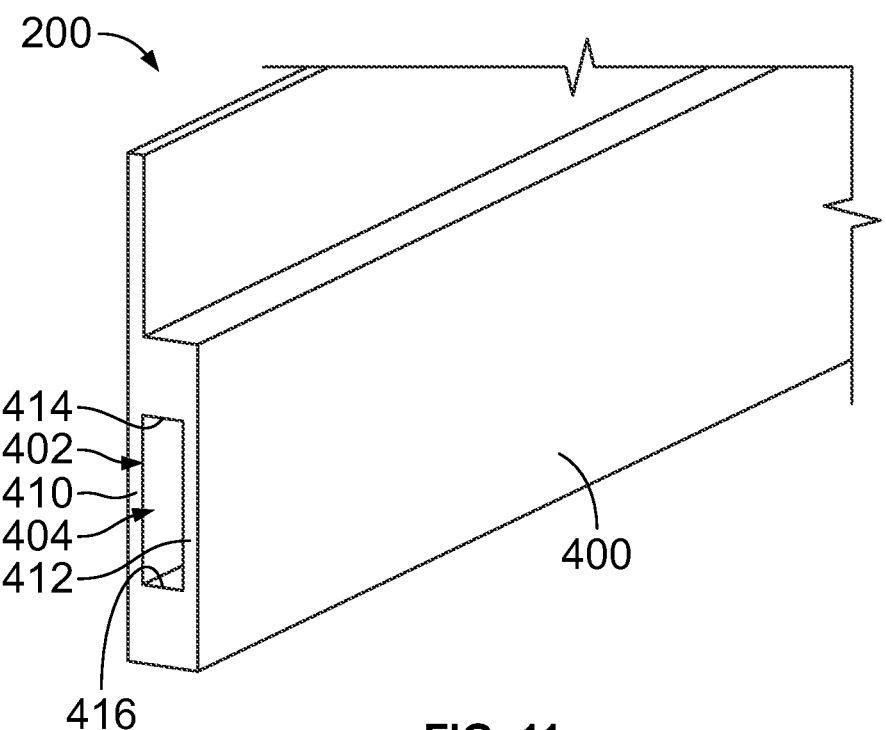
FIG. 11 is a perspective view of a portion of a busbar in accordance with an exemplary embodiment.

FIG. 11 is a perspective view of a portion of a busbar 400 in accordance with an exemplary embodiment. The busbar 400 may be used within the busbar assembly 200 in place of the first busbar 202 or the second busbar 204. The busbar 400 includes a thermal conduit 402 passing through the busbar 400. The thermal conduit 402 is formed by an internal channel 404 passing through the interior of the busbar 400. The thermal conduit 402 is defined by the busbar itself rather than utilizing a separate coolant tube that is coupled to the busbar. Liquid coolant is configured to flow through the internal channel 404, such as between an upper end and a lower end of the busbar 400. The liquid coolant transfers heat away from the busbar 400 to lower the operating temperature of the busbar 400.

In an exemplary embodiment, the busbar 400 is an extruded metal busbar having the internal channel 404 formed in a portion of the busbar 400. The internal channel 404 is enclosed by an inner side wall 410, an outer side wall 412, a front end wall 414, and a rear end wall 416. In the illustrated embodiment, the internal channel 404 as a rectangular cross-section; however, the internal channel 404 may have other shapes in alternative embodiments. In an exemplary embodiment, the nonconductive liquid coolant is used within the cooling system to flow through the thermal conduit 402.

Figure 12:
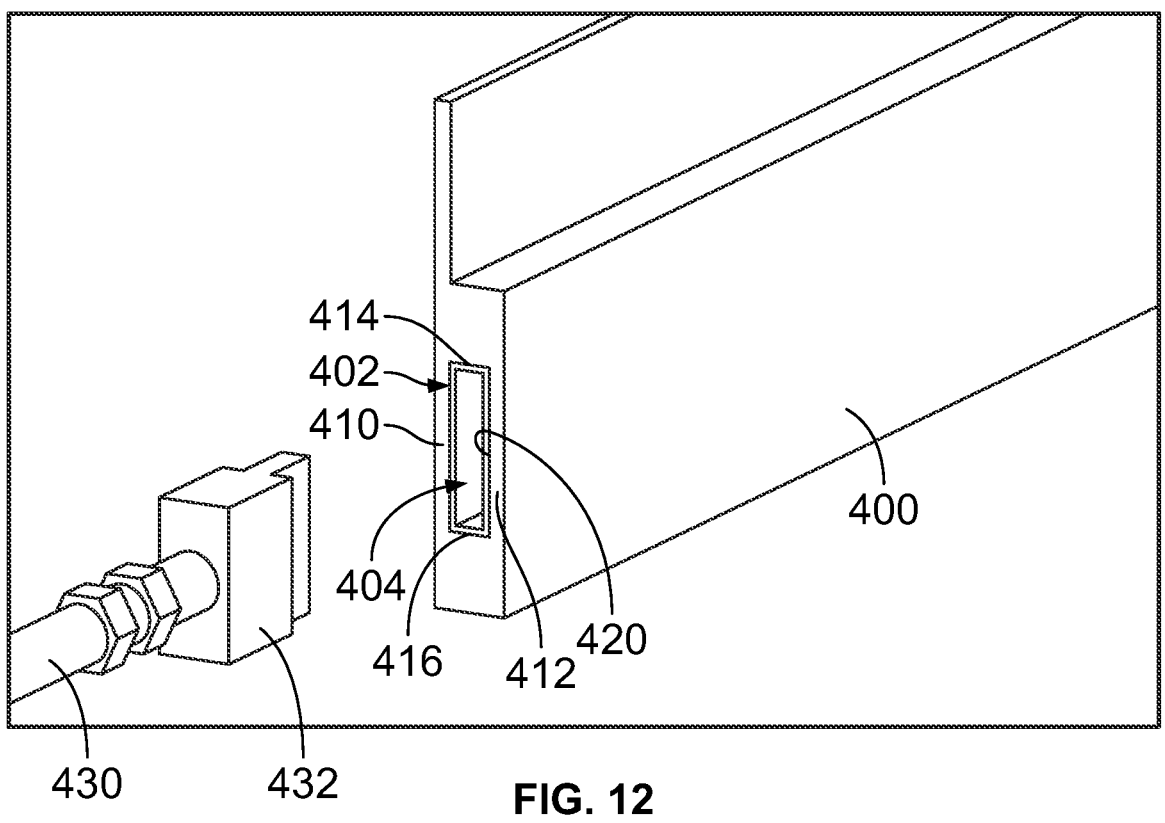
FIG. 12 is a perspective view of a portion of the busbar shown in FIG. 11 in accordance with an exemplary embodiment.

FIG. 12 is a perspective view of a portion of the busbar 400 in accordance with an exemplary embodiment. In the illustrated embodiment, the busbar 400 includes an insulative coating on the thermal conduit 402. For example, the interior surfaces of the walls 410, 412, 414, 416 defining the internal channel 404 have an electrically insulating layer 420 applied thereto to electrically isolate the liquid coolant from the busbar 400. In an exemplary embodiment, the electrical insulating layer 420 is thermally conductive to allow efficient heat transfer between the liquid coolant and the busbar 400. In various embodiments, the electrical insulating layer 420 may be a synthetic ceramic material, such as boron nitride, alumina, aluminum nitride, silica, or other thermally conductive and electrically insulating materials.

Coolant lines 430 may be coupled to the thermal conduit 402 (for example, supply and return). In an exemplary embodiment, each coolant line 430 includes a fitting 432 configured to be coupled to the busbar 400 to couple the coolant line 430 and the internal channel 404 in fluid communication. In various embodiments, the fitting 432 may be welded, raised, or otherwise sealed and joined to the busbar 400. Other types of fittings may be used in alternative embodiments, such as a threaded fitting.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A busbar assembly comprising:
a first busbar having a mating interface for mating with an electrical component to provide a power supply path for the electrical component;
a second busbar having a mating interface for mating with the electrical component to provide a power return path for the electrical component;
an isolator panel positioned between the first busbar and the second busbar, the isolator panel supporting the first busbar at a first side thereof, the isolator panel supporting the second busbar at a second side thereof, wherein the first and second busbars and the isolator panel extend along parallel paths through the busbar assembly in a busbar stack;
a first thermal conduit extending along the first busbar, the first thermal conduit allowing liquid coolant to flow therethrough to dissipate heat from the first busbar; and
a second thermal conduit extending along the second busbar, the second thermal conduit allowing liquid coolant to flow therethrough to dissipate heat from the second busbar.

2. The busbar assembly of claim 1, wherein the first busbar includes a first busbar channel, the first thermal conduit being located in the first busbar channel, wherein the second busbar includes a second busbar channel, the second thermal conduit being located in the second busbar channel.

3. The busbar assembly of claim 2, wherein the first busbar channel is open along a side of the first busbar to receive the first thermal conduit, the second busbar channel being open along the side of the second busbar to receive the second thermal conduit.

4. The busbar assembly of claim 2, wherein the first busbar channel is interior to the first busbar, the first thermal conduit passing through the interior of the first busbar, the second busbar channel being interior to the second busbar, the second thermal conduit passing through the interior of the second busbar.

5. The busbar assembly of claim 1, wherein the first thermal conduit is electrically isolated from the first busbar and the second thermal conduit is electrically isolated from the second busbar.

6. The busbar assembly of claim 1, wherein the first busbar extends between an upper end and a lower end, the first thermal conduit extending substantially an entire height of the first busbar between the upper end and the lower end, the second busbar extending between an upper end and a lower end, the second thermal conduit extending substantially an entire height of the second busbar between the upper end and the lower end.

7. The busbar assembly of claim 1, wherein the first thermal conduit is defined by a first coolant tube having a first coolant channel forming the first thermal conduit, the first coolant tube being thermally coupled to the first busbar, the second thermal conduit being defined by a second coolant tube having a second coolant channel forming the second thermal conduit, the second coolant tube being thermally coupled to the second busbar.

8. The busbar assembly of claim 7, wherein the first coolant tube is press-fit into a first channel in the first busbar and the second coolant tube is press-fit into a second channel in the second busbar.

9. The busbar assembly of claim 7, wherein the first coolant tube includes an electrical insulating layer to electrically isolate the first coolant tube from the first busbar and the second coolant tube includes an electrical insulating layer to electrically isolate the second coolant tube from the second busbar.

10. The busbar assembly of claim 7, further comprising support brackets coupled to the first and second busbars to secure the first and second coolant tubes to the first and second busbars, respectively.

11. The busbar assembly of claim 7, wherein the first coolant tube includes an inlet port and a return port, the liquid coolant flowing through the first coolant channel from the inlet port to the return port, the second coolant tube including in an inlet port and a return port, the liquid coolant flowing through the second coolant channel from the inlet port to the return port.

12. The busbar assembly of claim 1, further comprising:
a first supply line coupled to the first thermal conduit by a first supply fitting;
a first return line coupled to the first thermal conduit by a first return fitting;

a second supply line coupled to the second thermal conduit by a second supply fitting; and a second return line coupled to the second thermal conduit by a second return fitting.

13. The busbar assembly of claim 1, wherein the busbar assembly is a laminated structure with the isolator panel laminated between the first busbar and the second busbar.

14. The busbar assembly of claim 1, wherein the first busbar includes an inner surface and an outer surface opposite the inner surface, the inner surface facing the second busbar, the first busbar having a front and a rear, the first busbar having an upper end and a lower end, the mating interface of the first busbar being located proximate to the front, the first thermal conduit extending along the outer surface and located rearward of the mating interface, the first thermal conduit extending substantially an entire height of the first busbar between the upper end and the lower end, and wherein the second busbar includes an inner surface and an outer surface opposite the inner surface, the inner surface facing the first busbar, the second busbar having a front and a rear, the second busbar having an upper end and a lower end, the mating interface of the second busbar be located proximate to the front, the second thermal conduit extending along the outer surface and located rearward of the mating interface, the second thermal conduit extending substantially an entire height of the second busbar between the upper end and the lower end.

15. The busbar assembly of claim 1, further comprising
a third thermal conduit extending along the first busbar, the third thermal conduit allowing liquid coolant to flow therethrough to dissipate heat from the first busbar; and
a fourth thermal conduit extending along the second busbar, the fourth thermal conduit allowing liquid coolant to flow therethrough to dissipate heat from the second busbar.

16. The busbar assembly of claim 1, further comprising:
a first power supply electrically coupled to the first busbar, the first thermal conduit including an inlet port receiving the liquid coolant, the inlet port being located proximate to the first power supply; and
a second power supply electrically coupled to the second busbar, the second thermal conduit including an inlet port receiving the liquid coolant, the inlet port being located proximate to the second power supply.

17. A busbar assembly comprising:
a first busbar having a mating interface for mating with an electrical component to provide a power supply path for the electrical component, the first busbar having an inner surface and an outer surface opposite the inner surface, the outer surface defining the mating interface;
a second busbar having a mating interface for mating with the electrical component to provide a power return for the electrical component, the second busbar having an inner surface and an outer surface opposite the inner surface, the outer surface defining the mating interface, wherein the second busbar is oriented parallel to the first busbar with the inner surface of the second busbar facing the inner surface of the first busbar and electrically isolated therefrom, the mating interface of the second busbar facing outward in an opposite direction as the mating interface of the first busbar to mate with the electrical component;

a first coolant tube coupled to the power busbar, the first coolant tube having a first coolant channel forming a first thermal conduit along the first busbar, the first coolant tube allowing liquid coolant to flow through the first coolant channel to dissipate heat from the first busbar; and
a second coolant tube coupled to the power busbar, the second coolant tube having a second coolant channel forming a second thermal conduit along the second busbar, the second coolant tube allowing liquid coolant to flow through the second coolant channel to dissipate heat from the second busbar.

18. The busbar assembly of claim 17, wherein the first coolant tube includes an electrical insulating layer to electrically isolate the first coolant tube from the first busbar and the second coolant tube includes an electrical insulating layer to electrically isolate the second coolant tube from the second busbar.

19. The busbar assembly of claim 17, wherein the first coolant tube includes an inlet port and a return port, the liquid coolant flowing through the first coolant channel from the inlet port to the return port, the second coolant tube including in an inlet port and a return port, the liquid coolant flowing through the second coolant channel from the inlet port to the return port;
wherein the busbar assembly further comprises:
a first supply line coupled to the inlet port of the first coolant tube by a first supply fitting;
a first return line coupled to the return port of the first coolant tube by a first return fitting;
a second supply line coupled to the inlet port of the second coolant tube by a second supply fitting; and
a second return line coupled to the return port of the second coolant tube by a second return fitting.

20. An equipment rack comprising:
a frame forming a rack space configured to receive one or more electrical components; and
a busbar assembly coupled to the frame for powering the one or more electrical components, the busbar assembly including a first busbar having a mating interface for mating with the electrical component to provide a power supply path for the electrical component, the busbar assembly including a second busbar having a mating interface for mating with the electrical component to provide power return for the electrical component, the busbar assembly including an isolator panel positioned between the first busbar and the second busbar supporting the first and second busbars on opposite sides thereof, wherein the first and second busbars and the isolator panel extend along parallel paths through the busbar assembly in a busbar stack, the busbar assembly including a first thermal conduit extending along the first busbar, the busbar assembly including a second thermal conduit extending along the second busbar;
wherein the first thermal conduit allows liquid coolant to flow therethrough to dissipate heat from the first busbar and the second thermal conduit allows liquid coolant to flow therethrough to dissipate heat from the second busbar.

* * * * *